(12) United States Patent
Deweerd et al.

(10) Patent No.: US 8,906,812 B2
(45) Date of Patent: Dec. 9, 2014

(54) WET ETCH AND CLEAN CHEMISTRIES FOR $MOO_x$

(75) Inventors: Wim Deweerd, San Jose, CA (US); Kim Van Berkel, Mountain View, CA (US); Hiroyuki Ode, Hiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 563 days.

(21) Appl. No.: 13/165,923

(22) Filed: Jun. 22, 2011

(65) Prior Publication Data

US 2012/0329235 A1 Dec. 27, 2012

(51) Int. Cl.
*H01L 21/02* (2006.01)
*H01L 21/306* (2006.01)
*H01L 49/02* (2006.01)
*H01L 21/3213* (2006.01)

(52) U.S. Cl.
CPC .......... *H01L 28/60* (2013.01); *H01L 21/02087* (2013.01); *H01L 21/0209* (2013.01); *H01L 21/32134* (2013.01)
USPC ................... 438/754; 438/381; 257/E21.219; 257/E21.011

(58) Field of Classification Search
CPC .............. H01L 28/60; H01L 21/32134; H01L 21/0209; H01L 21/02087
USPC .................................................. 438/381, 754
See application file for complete search history.

(56) References Cited

U.S. PATENT DOCUMENTS 3,386,896 A * 6/1968 Finne .............................. 205/170
5,509,556 A * 4/1996 Balz et al. ........................ 216/56
2011/0104840 A1* 5/2011 Burdinski et al. ............... 438/34

OTHER PUBLICATIONS

Tai, Jim; Sputtering, Electrical Conductivity and Wet Etching of Molybdenum Films; 2005; Princeton University; Princeton Plasma Physics Laboratory Summer Program 2005 12 pages.
Brigham Young University; Wet Chemical Etching of Metals and Semiconductors; Feb. 8, 2011; Brigham Young University; Department of Electrical and Computer Engineering; http://www.cleanroom.byu.edu/wet_etch.phtml, 3 pages.
SiliconFarEast; Wet Etching Recipes; Feb. 8, 2011; SiliconFarEast; http://www.siliconfareast.com/etch_recipes.htm, 2 pages.
Kruglick; Wet Etch Recipes; Apr. 25, 2007; http://ardentresearch.com/forum/index.php?topic=22.0; MEMS and Nanotech Forums sponsored by Ardent Research, 5 pages.

* cited by examiner

*Primary Examiner* — Alexander Ghyka

(57) ABSTRACT

A method of removing non-noble metal oxides from material (e.g., semiconductor material) used to make a microelectronic device includes providing the material comprising traces of the conducting non-noble metal oxides; applying a chemical mixture (or chemical solution) to the material; removing the traces of the non-noble metal oxides from the material; and removing the chemical mixture from the material. The non-noble metal oxides comprise $MoO_x$, wherein x is a positive number between 0 and 3. The chemical solution comprises any one of $HNO_3$-based chemicals, $H_2SO_4$-based chemicals, HCl-based chemicals, or $NH_4OH$-based chemicals.

18 Claims, 10 Drawing Sheets

WET ETCH AND CLEAN CHEMISTRIES FOR $MOO_x$

BACKGROUND

1. Technical Field

The embodiments herein generally relate to semiconductor processing, and more specifically, to wet etch and clean chemistries used in semiconductor processing.

2. Description of the Related Art

In order to achieve a high-k capacitor with an effective oxide thickness (EOT) less than 0.65 nm and a physical thickness less than 10 nm for the dielectric film of a dynamic random access memory (DRAM) device, very high-k, typically crystalline materials, are needed (i.e., k>50). As the value of k for the dielectric increases, the band gap (Eg) of the dielectric material is reduced and hence, the device leakage increases unfavorably. To counter the high leakage, electrodes made of sufficiently conductive materials with high work function and barrier heights are required to complement the high-k dielectrics used. Noble metal electrodes are typically the first option but given their high cost and common difficulties handling/processing them, they are not a practical solution for production. Conducting non-noble metal oxides (e.g., $MoO_2$ because of its compelling lower cost than other material candidates and its ability to be safely processed) are interesting materials that could be used as the material is sufficiently conductive, and they can allow appropriate templating of the required crystallographic phase during the subsequent high-k deposition.

However, with the use of these new non-noble electrode systems in the manufacturing process of microelectronic products, new challenges arise as how to remove them from areas where their presence is undesirable. As an example, Mo being near noble (i.e. inert) is difficult to remove. As another example, trace amounts of these metals on the back side or bevel areas of the wafer can cause cross-contamination during production, typically mandating a suitable cleaning process to lower their surface concentrations to acceptable levels. Another example includes selective removal of the bulk electrode material during patterning of the deep sub-micron electric device capacitor feature for DRAM products. This can be accomplished by using a photoresist process or a hardmask process or any other known method for pattern transfer. The amount of material that is to be removed delineates the difference between wet etch (removing bulk material) and wet clean (removing trace amounts of material).

There remains a need to identify appropriate wet chemistries that are viable for DRAM production using non-noble materials such as $MoO_2$ and that have a high capability of removing Mo and $MoO_2$ from a silicon wafer during the manufacturing process using a wet chemistry process.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein are directed towards chemistries used to clean/etch a specific type of material (e.g., $MoO_x$), where $0 \leq x \leq 3$ and specifically the embodiments herein provide a method that includes providing a semiconductor material comprising non-noble metal oxides; applying a chemical solution to the semiconductor material; removing the non-noble metal oxides from the semiconductor material; and removing the chemical solution from the semiconductor material. Referring now to the drawings, and more particularly to FIGS. 1A through 7, where similar reference characters denote corresponding features consistently throughout the figures, there are shown embodiments.

DRAM process development with equivalent oxide thickness (EOT) targets of ≤0.6 nm focuses on the use of non-noble electrode material. $MoO_x$ can be used for this purpose. During integration of this material into an electrical device, identifying a wet etchant with sufficient etch rate and selectivity towards other materials such as dielectric films or other metals used in the metal-insulator-metal (MIM) capacitor device is desirable. This chemistry can also be used to clean Mo from the backside, edge, and bevel of the wafers for contamination avoidance purposes. Several chemistries can be used to achieve these purposes, including $NH_4OH$, $HNO_3$, and HCl based chemicals.

Figure 1A:
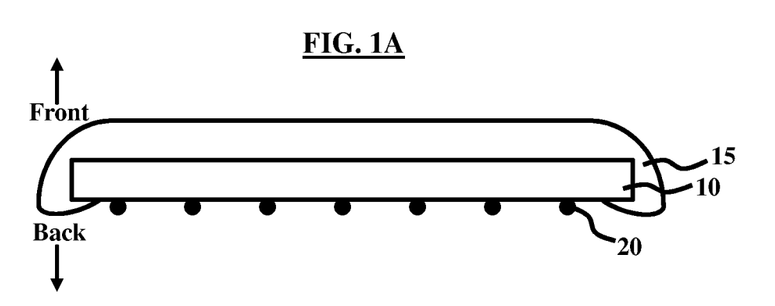
FIG. 1A illustrates a cross-sectional view of a semiconductor wafer before a back side etching process occurs according to an embodiment herein.

FIG. 1A illustrates a cross-sectional view of a semiconductor wafer 10 before a back side etching process occurs according to an embodiment herein. The wafer 10 includes a film of non-noble metal oxide 15 deposited thereon. While the oxide 15 is generally deposited (e.g., through atomic layer deposition (ALD)) on the front side of the wafer 10, as shown in FIG. 1A, portions of the oxide 15 extend to the back side of the wafer 10 as well. This results in the existence of traces (e.g., particles, atoms, etc.) 20 of the non-noble metal oxide 15 on the back side of the wafer 10. The film of non-noble metal oxide 15 and traces 20 comprise $MoO_x$, wherein x is a positive number between 0 and 3 ($0 \leq x \leq 3$). The oxide 15 and traces 20 may be conducting or non-conducting. For example, if x is 2, then the oxide 15 and traces 20 are $MoO_2$, which is conducting, whereas if x is 3, then the oxide 15 and the traces 20 are $MoO_3$, which is non-conducting. The actual film may be a mixture of phases.

Figure 1B:
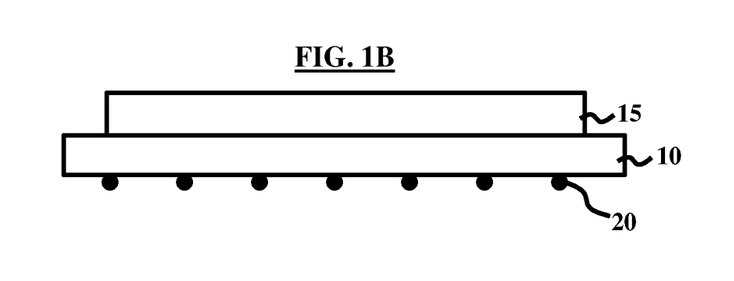
FIG. 1B illustrates a cross-sectional view of a semiconductor wafer after a back side etching process occurs according to an embodiment herein.
Figure 2A:
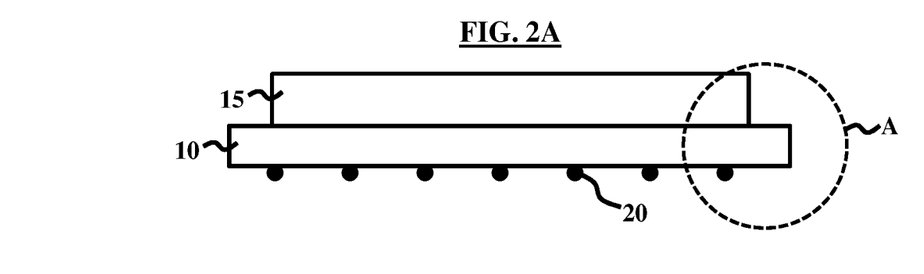
FIG. 2A illustrates a cross-sectional view of a semiconductor wafer before a cleaning process occurs according to an embodiment herein.
Figure 2B:
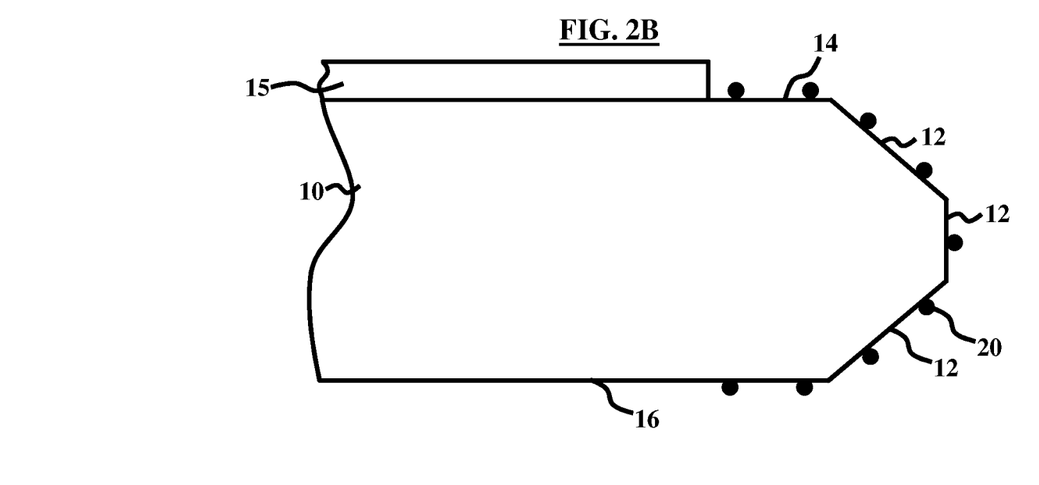
FIG. 2B illustrates an isolated magnified view of area A of FIG. 2A according to an embodiment herein.

FIG. 1B illustrates a cross-sectional view of the wafer 10 of FIG. 1A after a back side etching process occurs according to an embodiment herein. The etching process results in selective removal of portions of the oxide 15. FIGS. 2A and 2B illustrate a cross-sectional view of the wafer 10 of FIGS. 1A and 1B before a cleaning process occurs according to an embodiment herein where FIG. 2B illustrates an isolated magnified view of area A of FIG. 2A according to an embodiment herein. The magnified view shown in FIG. 2B illustrates that traces 20 of the oxide 15 remain on the bevel 12, edge 14, and back surface 16 of the wafer 10.

Figure 2C:
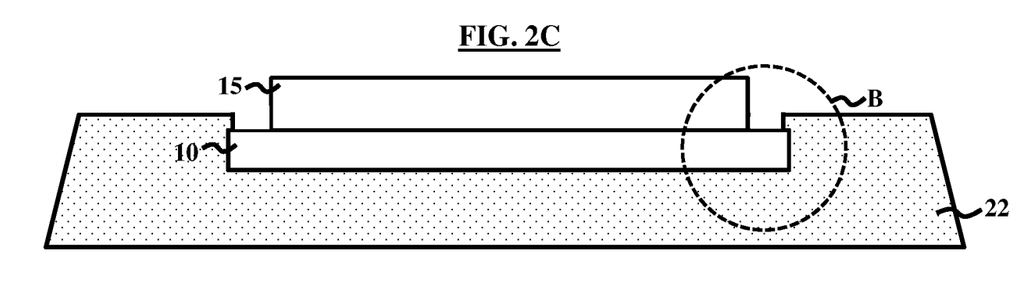
FIG. 2C illustrates a cross-sectional view of a semiconductor wafer after a cleaning process occurs according to an embodiment herein.
Figure 2D:
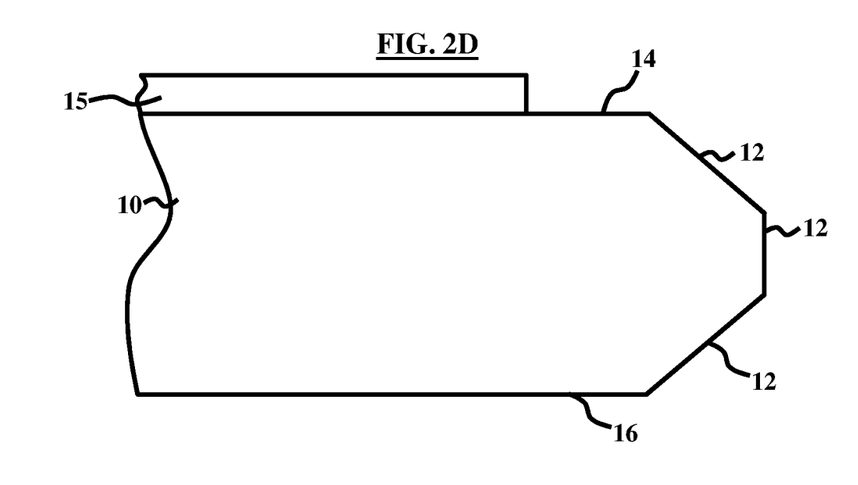
FIG. 2D illustrates an isolated magnified view of area B of FIG. 2C according to an embodiment herein.

FIGS. 2C and 2D, with respect to FIGS. 1A through 2B, illustrate a cross-sectional view of the wafer 10 after a cleaning process occurs according to an embodiment herein. A chemical mixture (or solution) 22 is introduced to the wafer 10 in order to remove the oxide 15 and traces 20 as well. The chemical mixture 22 may be applied with any appropriate tool that dispenses the chemical mixture 22 to only specific areas on the wafer 10. As an example, the chemical mixture 22 may be applied in a spin processing tool wherein the chemicals are supplied from under the wafer. The amount of chemical that flows over the edge to the front of the wafer can be controlled by the speed of the wafer rotation. This allows the backside and bevel of the wafer to be cleaned without affecting the frontside of the wafer. FIG. 2D illustrates an isolated magnified view of area B of FIG. 2C according to an embodiment herein, and for clarity, the chemical mixture (or solution) 22 is not shown in FIG. 2D. In this view, no traces 20 are present on the bevel 12, edge 14, or back surface 16 of the wafer 10. The cleaning process can be performed at various stages of processing and for various reasons (e.g., precaution after using shared processing tools, etc.).

The chemical mixture 22 may include any one of $HNO_3$-based chemicals, $H_2SO_4$-based chemicals, HCl-based chemicals, or $NH_4OH$-based chemicals. In one embodiment, the $HNO_3$-based chemicals may comprise any one of (i) a mixture of $HNO_3$, HCl, and $H_2O$; (ii) a mixture of $HNO_3$, $H_3PO_4$, $CH_3COOH$, and $H_2O$; or (iii) a mixture of $HNO_3$, $NH_4F$, and $H_2O$. In another embodiment, the $H_2SO_4$-based chemicals may comprise a mixture of $H_2SO_4$ and $H_2O_2$. In yet another embodiment, the HCl-based chemicals may comprise a mixture of HCl, $H_2O_2$, and $H_2O$. In still another embodiment, the $NH_4OH$-based chemicals may comprise a mixture of $NH_4OH$, $H_2O_2$, and $H_2O$.

Figure 3A:
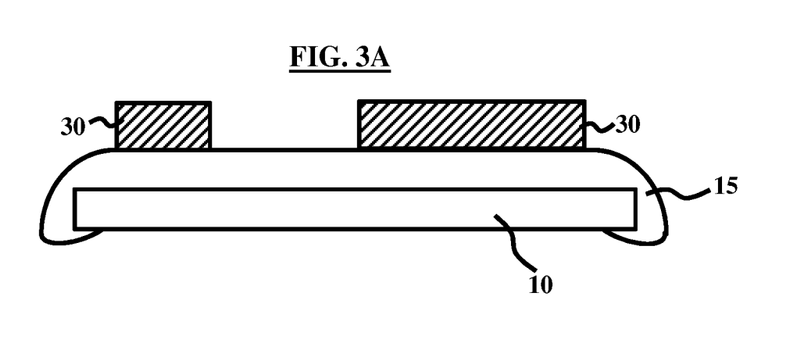
FIG. 3A illustrates a cross-sectional wafer-level view before a front side etching process occurs according to an embodiment herein.
Figure 3B:
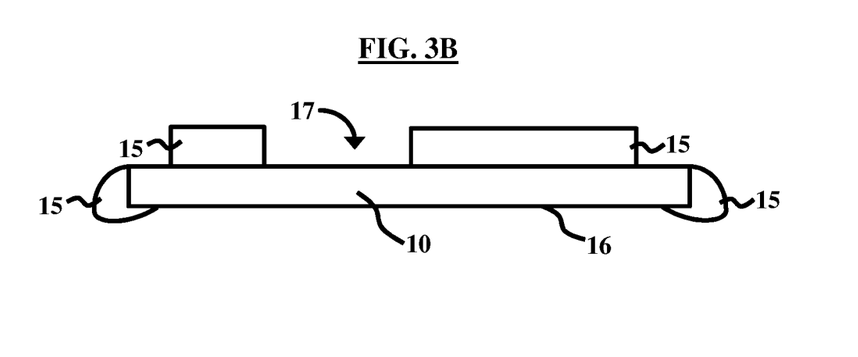
FIG. 3B illustrates a cross-sectional wafer-level view after a front side etching process occurs according to an embodiment herein.

FIG. 3A, with reference to FIGS. 1A through 2D, illustrates a cross-sectional wafer-level view of the wafer 10 before a front side reactive ion etching (RIE) etching process occurs according to an embodiment herein. A photoresist or hardmask 30 may be placed on the film of oxide 15 in order to perform a patterning process (e.g., lithography). FIG. 3B, with reference to FIGS. 1A through 3A, illustrates a cross-sectional wafer-level view of the wafer 10 after a front side RIE etching process occurs to create patterned areas 17 in the film of oxide 15 according to an embodiment herein. While not shown in FIGS. 3A and 3B, traces 20 of the oxide 15 may exist on the back side of the wafer 10 and after application of the chemical mixture 22, the traces 20 are removed from the bevel 12, edge 14, and back surface 16 of the wafer.

Figure 4A:
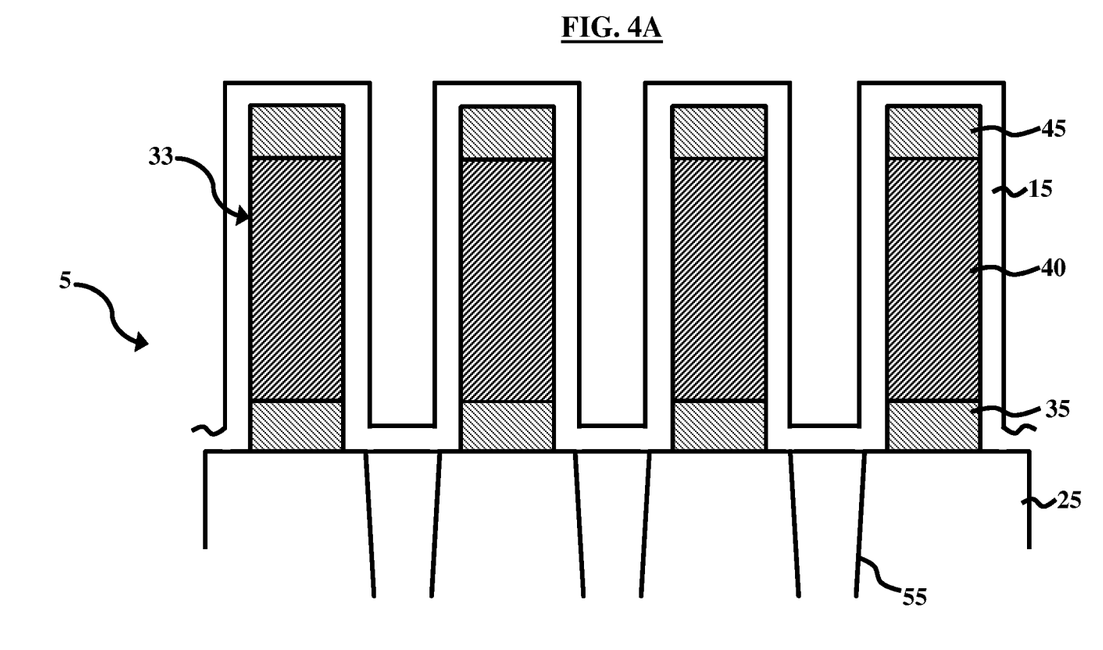
FIG. 4A illustrates a cross-sectional device-level view after an etching process occurs according to an embodiment herein.
Figure 4B:
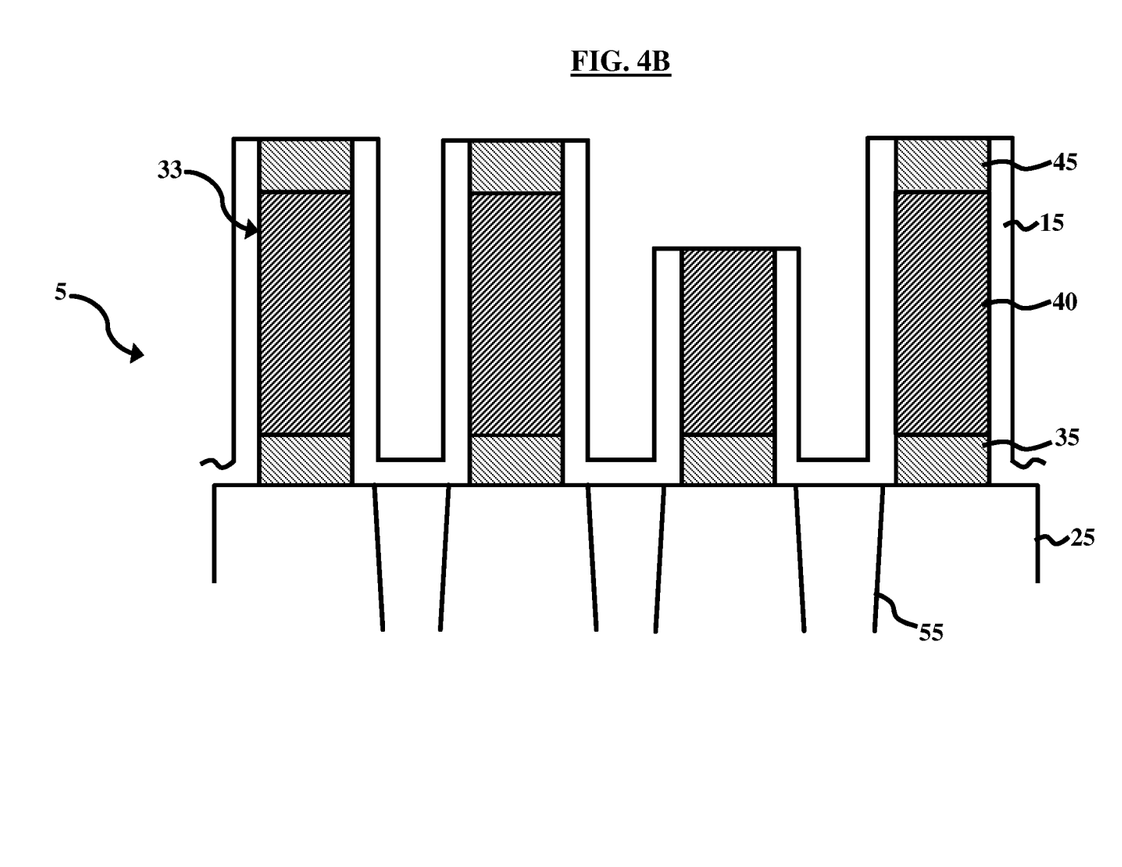
FIG. 4B illustrates a cross-sectional device-level view after a subsequent etching process occurs according to an embodiment herein.

FIGS. 4A and 4B, with reference to FIGS. 1A through 3B, illustrate cross-sectional device-level views of a microelectronic device 5 after subsequent RIE etching processes occur according to an embodiment herein. FIGS. 4A and 4B are device-level views (i.e., approximately less than one micrometer) compared with the wafer-level views (i.e., approximately 20 centimeters) of FIGS. 3A and 3B, thus more detailed configurations of the microelectronic device 5 is shown in FIGS. 4A and 4B. For example, the microelectronic device 5 comprises a silicon oxide back end layer 25 with a dielectric stack 33 that comprises a pair of silicon oxide layers 35, 45 sandwiching a silicon nitride layer 40. In another embodiment, the dielectric stack 33 comprises a pair of silicon nitride layers 35, 45 sandwiching a silicon oxide layer 40. The film of oxide 15 is deposited over the dielectric stack 33. Contacts 55 extend from the oxide 15 to the underlying metallization layers (not shown) of the silicon oxide back end layer 25. FIG. 4B illustrates the device of FIG. 4A after portions of the film of oxide 15 has been removed by a RIE etch process. Also illustrated in FIG. 4B, the RIE etch process may remove selected portions of the silicon nitride layer 45 and the silicon oxide layer 40 depending on the details of the photoresist pattern (not shown). FIG. 4B is used for illustration purposes only and is not intended to fully describe an actual device structure.

Preferably, the chemical mixture 22 selectively removes the oxide 15 without removing the underlying dielectric stack 33.

Figure 5A:
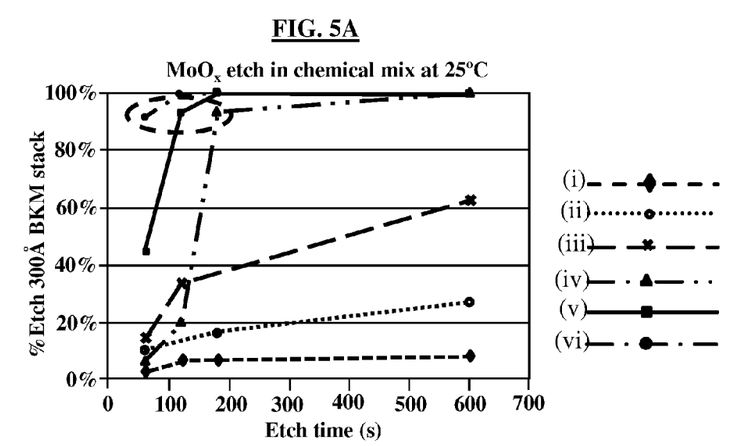
FIG. 5A is a graphical representation illustrating the results of a $MoO_x$ etch in a chemical mixture at 25° C.

FIG. 5A, with reference to FIGS. 1A through 4B, is a graphical representation illustrating the results of a $MoO_x$ etch in a chemical mixture (e.g., chemical mixture 22) at 25° C. As shown in FIG. 5A, the results of using various chemical mixtures 22 are shown. Preferably, the $MoO_x$ (e.g., oxide 15) is fully etched (i.e., removed), which equates to a 100% etch on the vertical (y) axis of the graph. The encircled area on the graph of FIG. 5A indicates nearly a 100% $MoO_x$ etch occurring within the first 200 seconds of the etching process at 25° C.

Figure 5B:
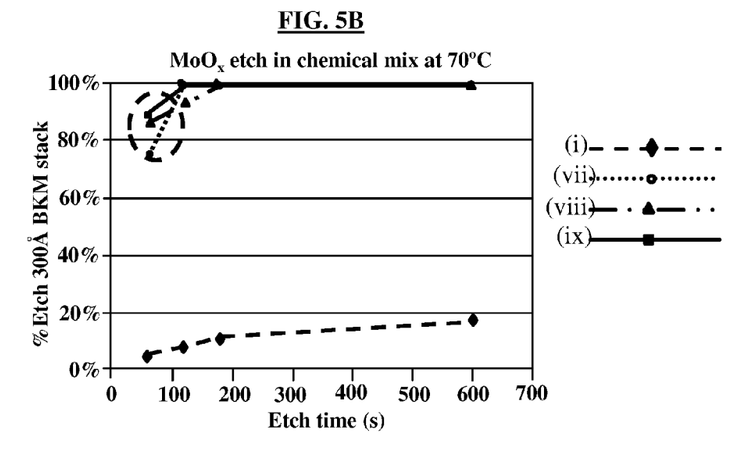
FIG. 5B is a graphical representation illustrating the results of a $MoO_x$ etch in a chemical mixture at 70° C.

FIG. 5B, with reference to FIGS. 1A through 4B, is a graphical representation illustrating the results of a $MoO_x$ etch in a chemical mixture (e.g., chemical mixture 22) at 70° C. As shown in FIG. 5B, the results of using various chemical mixtures 22 are shown. Preferably, the $MoO_x$ (e.g., oxide 15) is fully etched (i.e., removed), which equates to a 100% etch on the vertical (y) axis of the graph. The encircled area on the graph of FIG. 5B indicates approximately an 80% $MoO_x$ etch occurring within the first 100 seconds of the etching process at 70° C.

Figure 5C:
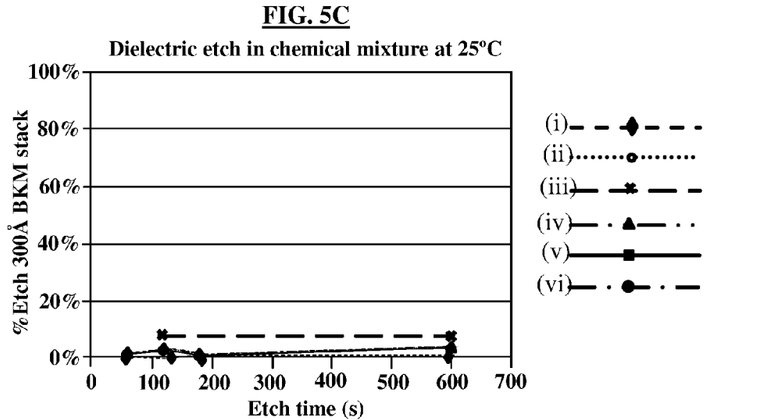
FIG. 5C is a graphical representation illustrating the results of a dielectric etch in a chemical mixture at 25° C.

FIG. 5C, with reference to FIGS. 1A through 4B, is a graphical representation illustrating the results of a dielectric etch in a chemical mixture (e.g., chemical mixture 22) at 25° C. As shown in FIG. 5C, the results of using various chemical mixtures 22 are shown. Preferably, the dielectric (e.g., dielectric stack 33) is not removed during the etching process (i.e., removal of the overlying oxide 15 on top of the dielectric stack 33), which equates to a 0% etch on the vertical (y) axis of the graph. The results of FIG. 5C indicate that regardless of the type of chemical mixture 22 that is used for the etching, the dielectric stack 33 remains substantially in place during the etching process at 25° C.

Figure 5D:
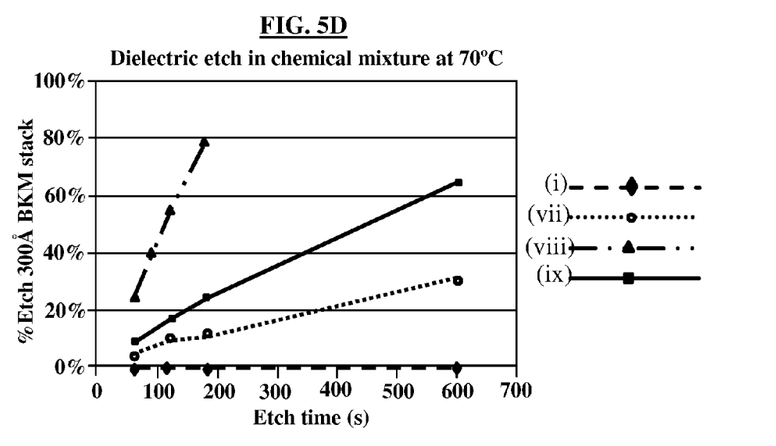
FIG. 5D is a graphical representation illustrating the results of a dielectric etch in a chemical mixture at 70° C.

FIG. 5D, with reference to FIGS. 1A through 4B, is a graphical representation illustrating the results of a dielectric etch in a chemical mixture (e.g., chemical mixture 22) at 70° C. As shown in FIG. 5D, the results of using various chemical mixtures 22 are shown. Preferably, the dielectric (e.g., dielectric stack 33) is not removed during the etching process (i.e., removal of the overlying oxide 15 on top of the dielectric stack 33), which equates to a 0% etch on the vertical (y) axis of the graph. The results of FIG. 5D indicate mixed results for the various chemical mixtures 22 that are used for the etching, where the percentage of the dielectric stack 33 that is removed during the etching process at 70° C. varies between 0% are approximately 25% at approximately 50 seconds of etch time.

Table 1 below describes the chemical mixtures 22 indicated in the graphs of FIGS. 5A through 5D.

TABLE 1

| Chemical Mixture | Chemistry |
| --- | --- |
| (i) | $H_2O$ |
| (ii) | $1HCl:1H_2O_2:5H_2O$ |
| (iii) | $126HNO_3:5NH_4F:60H_2O$ |
| (iv) | $180H_3PO_4:11HNO_3:11CH_3CHOOH:150H_2O$ |
| (v) | $30H_3PO_4:18HNO_3:10CH_3COOH:65H_2O$ |
| (vi) | $1HNO_3:3HCl:2H_2O$ |
| (vii) | $50H_2SO_4:1H_2O_2$ |
| (viii) | $1HCl:1H_2O_2:5H_2O$ |
| (ix) | $4H_2SO_4:1H_2O_2$ |

Figure 6A:
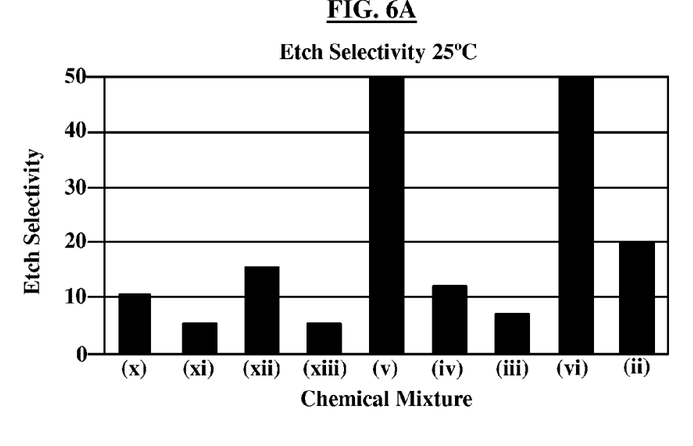
FIG. 6A is a graphical representation illustrating the etch selectivity using various chemical mixtures at 25° C.
Figure 6B:
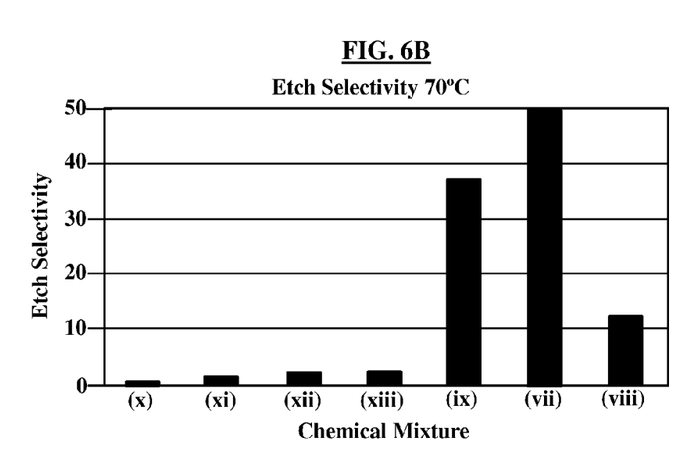
FIG. 6B is a graphical representation illustrating the etch selectivity using various chemical mixtures at 70° C.

FIG. 6A is a graphical representation illustrating the etch selectivity using various chemical mixtures at 25° C., and FIG. 6B is a graphical representation illustrating the etch selectivity using various chemical mixtures at 70° C. The etch selectivity is the ratio of the etch rate of the Mo (e.g., non-noble metal oxide 15) divided by the etch rate of the wafer 10. The chemical mixtures 22 with a relatively high etch selectivity ratio is preferred to chemical mixtures 22 with a lower etch selectivity ratio because a higher ratio suggests more non-noble metal oxide 15 removal and less dielectric stack 33 removal. Table 2 below describes the chemical mixtures 22 indicated in the graphs of FIGS. 6A and 6B. The chemical mixtures 22 described in Table 2 are base chemistries (e.g., chemistry containing an OH-group, as opposed to acids that contain an H+ group) and generally have lower etch selectivities than the $HNO_3$-based acid chemistries, especially at higher temperatures as indicated in FIG. 6B.

TABLE 2

| Chemical Mixture | Chemistry |
| --- | --- |
| (x) | $1NH_4OH:1H_2O_2:20H_2O$ |
| (xi) | $1NH_4OH:1H_2O_2:5H_2O$ |
| (xii) | $1NH_4OH:1H_2O_2:50H_2O$ |
| (xiii) | $1NH_4OH:4H_2O_2:20H_2O$ |

Figure 7:
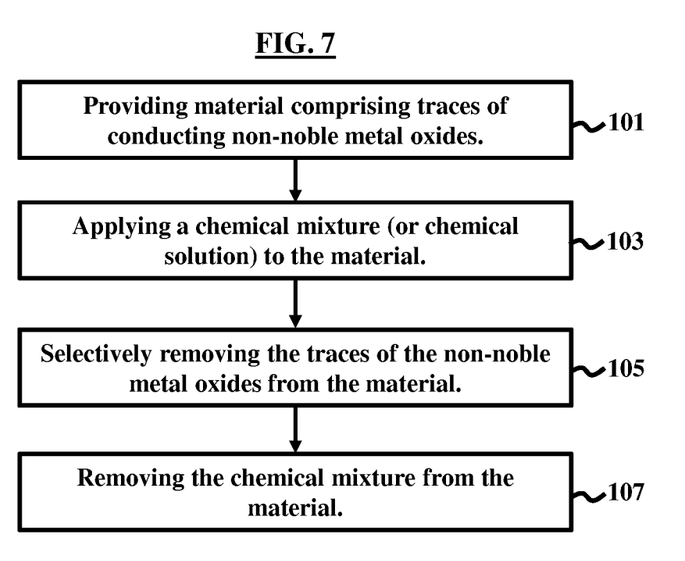
FIG. 7 illustrates a flow diagram according to an embodiment herein.

FIG. 7, with reference to FIGS. 1A through 6B, is a flow diagram illustrating a method of removing non-noble metal oxides 15, 20 from material (e.g., semiconductor material (e.g., wafer 10)) used to make a microelectronic device 5. The method, which is illustrated in the flowchart of FIG. 1, includes providing (101) the material (e.g., wafer 10) comprising at least traces 20 of the conducting non-noble metal oxides 15; applying (103) a chemical mixture 22 (or chemical solution) to the material (e.g., wafer 10); selectively removing (105) the traces 20 of the non-noble metal oxides 15 from the material (e.g., wafer 10); and removing (107) the chemical mixture 22 from the material (e.g., wafer 10).

In one embodiment, the application of the chemical mixture 22 may occur in a temperature range of between 20° C. and 80° C. In another embodiment, the application of the chemical mixture 22 may occur at temperatures greater than 80° C. to achieve the required etch rates and selective removal of other films/materials that are present on the microelectronic device 5. In an alternative embodiment, a patterned photoresist or hardmask 30 is applied over the material (e.g., wafer 10) prior to the application of the chemical mixture 22. Preferably, the removed traces 20 of the non-noble metal oxides 15 remain in solution of the chemical mixture 22 without re-attaching to the material (e.g., wafer 10).

The selective removal of the traces 20 of the non-noble metal oxides 15 from the material (e.g., wafer 10) can include any of a wet etching process and a wet cleaning process. In this regard, any suitable production tool (not shown) may be used to apply the chemical mixture 22 based on the type of processing that is desired (i.e., wet etching process or wet cleaning process). Furthermore, the selective removal of the traces 20 of the non-noble metal oxides 15 from the material (e.g., wafer 10) can include selective removal of the traces 20 of the non-noble metal oxides 15 from a silicon wafer 10.

The embodiments herein provide a method to integrate high work function materials to enhance DRAM device performance and further provide an inexpensive and easily manufacturable solution for DRAM technologies using non-noble $MoO_x$ electrodes by enabling a wet cleaning and etching process for pattern transfer and substrate cleaning. Two example applications of using the methodology provided by the embodiments herein include (i) wafer back side cleaning, and (ii) bulk etching. The embodiments herein overcome the deficiencies of existing conventional back side cleaning processes that typically contaminate the back side (e.g., Cu material). In the context of the bulk cleaning process, the embodiments herein permit removal of bulk quantities; e.g., during photoresist or hardmask pattern etching. This may occur on either the front or back side of the wafer 10.

As an example of the use of the present invention in the patterning of a DRAM electrode as part of the fabrication of a capacitor stack, a conductive $MoO_x$ layer may be deposited on a substrate. Generally, the substrate has already received several processing steps in the manufacture of a full DRAM device. The chemistries of some embodiments of the present invention may be applied to clean the backside, edge, and bevel of the substrate before it proceeds to the patterning step. This cleaning step prevents contamination from being carried from the deposition step into the patterning step. Next, a photoresist or hardmask is applied on the $MoO_x$ layer. The chemistries of some embodiments of the present invention are used in an etch process to remove the bulk layer as part of the patterning process. Next, the photoresist or hardmask is removed and the chemistries of some embodiments of the present invention may be applied to clean the backside, edge, and bevel of the substrate before it proceeds to the step. The sequence of mask-etch-remove mask-clean may be repeated several times until the $MoO_x$ electrode layer is properly patterned. Furthermore, these steps may be used for the bottom electrode, the top electrode, or both electrodes.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of removing non-noble metal oxides from semiconductor substrate used to make a microelectronic device, said method comprising:

providing a semiconductor substrate comprising silicon oxide, silicon nitride, and traces of conducting non-noble metal oxides,
  wherein said non-noble metal oxides comprise MoOx, ($0<x\leq3$);
applying a chemical mixture to said semiconductor substrate,
  wherein said chemical mixture comprises $NH_4OH$,
  wherein said chemical mixture selectively and completely removes said traces of said non-noble metal oxides from said semiconductor substrate while retaining the silicon oxide and the silicon nitride; and
removing said chemical mixture from said semiconductor substrate.

2. The method of claim 1, wherein said chemical mixture further comprises $H_2O_2$ and $H_2O$.

3. The method of claim 1, wherein the applying of said chemical mixture occurs in a temperature range of between 20° C. and 80° C.

4. The method of claim 1, further comprising applying anyone of a patterned photoresist or hardmask over said semiconductor substrate prior to the applying of said chemical mixture.

5. The method of claim 1, wherein removed said traces of said non-noble metal oxides remain in solution of said chemical mixture without re-attaching to said semiconductor substrate.

6. The method of claim 1, wherein said removing said traces of said non-noble metal oxides from said semiconductor substrate comprises anyone of a wet etching process or a wet cleaning process.

7. The method of claim 1, wherein said removing said traces of said non-noble metal oxides from said semiconductor substrate comprises removing said traces of said non-noble metal oxides from a silicon wafer.

8. The method of claim 1, wherein said traces of said conducting non-noble metal oxides are also removed from a bevel of the semiconductor substrate.

9. The method of claim 1, wherein the traces of the conducting non-noble metal oxides are removed from a top side of the semiconductor substrate.

10. The method of claim 1, wherein applying the chemical mixture to said semiconductor substrate is performed while spinning the semiconductor substrate.

11. The method of claim 10, wherein the chemical mixture is applied to a backside of the semiconductor substrate.

12. The method of claim 11, wherein the chemical mixture does not contact a front side of the semiconductor substrate when the chemical mixture is applied to the semiconductor substrate.

13. The method of claim 1, wherein the traces of the conducting non-noble metal oxides are removed from a bottom side of the semiconductor substrate.

14. The method of claim 2, wherein composition of the chemical mixture is 1 part of $NH_4OH$ to 1 part of $H_2O_2$ to 20 parts of $H_2O$.

15. The method of claim 2, wherein composition of the chemical mixture is 1 part of $NH_4OH$ to 1 part of $H_2O_2$ to 5 parts of $H_2O$.

16. The method of claim 2, wherein composition of the chemical mixture is 1 part of $NH_4OH$ to 1 part of $H_2O_2$ to 50 parts of $H_2O$.

17. The method of claim 2, wherein composition of the chemical mixture is 1 part of $NH_4OH$ to 4 part of $H_2O_2$ to 20 parts of $H_2O$.

18. The method of claim 1, wherein applying of the chemical mixture is performed at a temperature of greater than 80° C.

* * * * *